(12) United States Patent
Khurana et al.

(10) Patent No.: US 7,196,942 B2
(45) Date of Patent: Mar. 27, 2007

(54) CONFIGURATION MEMORY STRUCTURE

(75) Inventors: Anoop Khurana, New Delhi (IN);
Parvesh Swami, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/254,558

(22) Filed: Oct. 20, 2005

(65) Prior Publication Data
US 2006/0120141 A1 Jun. 8, 2006

(30) Foreign Application Priority Data
Oct. 20, 2004 (IN) .................. 2053/DEL/2004

(51) Int. Cl.
*G11C 7/10* (2006.01)
*G11C 7/00* (2006.01)

(52) U.S. Cl. .......... 365/189.05; 365/203; 365/230.03; 326/38; 326/40; 326/41

(58) Field of Classification Search .......... 365/189.05
See application file for complete search history.

(56) References Cited

U.S. PATENT DOCUMENTS

| | | | | |
|---|---|---|---|---|
| 5,414,714 A | * | 5/1995 | Gladden et al. .......... 714/731 |
| 5,661,675 A | * | 8/1997 | Chin et al. .................. 708/670 |
| 5,748,556 A | * | 5/1998 | Iyengar .................. 365/230.06 |
| 5,889,417 A | * | 3/1999 | Klass et al. .................. 326/98 |
| 5,892,372 A | * | 4/1999 | Ciraula et al. ................ 326/96 |
| 5,905,684 A | * | 5/1999 | Hill ............................. 365/203 |
| 6,057,704 A | | 5/2000 | New et al. .................... 326/38 |
| 6,097,209 A | * | 8/2000 | Fujimoto ..................... 326/27 |
| 6,150,846 A | * | 11/2000 | Sakamoto .................... 326/86 |
| 6,570,792 B2 | * | 5/2003 | Fujimoto ............... 365/189.05 |
| 6,664,807 B1 | * | 12/2003 | Crotty et al. ................. 326/40 |
| 6,687,166 B1 | * | 2/2004 | Takahashi et al. ...... 365/189.05 |
| 2005/0146357 A1 | * | 7/2005 | Anders et al. ................ 326/86 |

* cited by examiner

*Primary Examiner*—Son L. Mai
(74) *Attorney, Agent, or Firm*—Lisa K. Jorgenson; Robert Iannucci; Seed IP Law Group PLLC

(57) ABSTRACT

A configuration memory structure includes one or more distributed buffers cascaded together, the output of a first buffer driving an output data line and complementary output data line which terminate at the input of a succeeding buffer. The first buffer includes precharging elements connected between a source and the data line and complementary data line, respectively; data sensing and holding elements connected between respective input and complementary input data lines and the data line and complementary data line, respectively; and tristate elements connected to the outputs of the data sensing and holding elements. This scheme provides fast and reliable configuration and configuration read back, especially for a high density FPGA.

20 Claims, 4 Drawing Sheets

CONFIGURATION MEMORY STRUCTURE

BACKGROUND OF THE INVENTION

1. Field of the Invention

The invention relates to an improved configuration memory structure using one or more distributed buffers.

2. Description of the Related Art

Field programmable gate arrays (FPGAs) are semi-custom devices, which contain a fixed set of gate structures, which can be interconnected in a number of ways to implement a desired logic function by programming the interconnect pattern electrically.

FPGAs generally include an array of programmable logic blocks (PLB). A PLB is also called a configurable logic block (CLB) or a configurable logic element (CLE) or programmable function unit (PFU). Each PLB contains one or more input lines, one or more output lines, one or more latches and one or more look up tables (LUT). The LUT can be programmed to perform various functions including general combinatorial or control logic or a data path between the input and output lines. The LUT thus determines whether the respective PLB implements a general logic, or a special mode function such as an adder, a subtractor, a counter or a register.

The configuration values stored in static random access memory (SRAM) latches program the connections or select the functionality for LUT. These SRAM cells are volatile in nature to provide reconfiguration flexibility. Using this flexibility, a number of iterations for design implementation can be tried with an FPGA device to achieve the system specifications. This technique is very useful for prototyping a new design during a developing and debugging stage, which significantly reduces developing and manufacturing expenses and time. The verification and debugging of the implemented design is done by reading the configuration data and comparing the same with the configuration bits. The configurable memory cells of a PLD are typically arranged in an array and loaded using serial bit streams of configuration data.

FIG. 1 illustrates a configuration memory array according to the prior art. Configuration memory array 150 comprises memory cells 100-$_{xy}$ where x and y correspond to the column and row location respectively of each configuration memory cell.

The configuration of data into the configuration memory array 150 is achieved by shifting the bit stream of configuration data. This frame of data from configuration shift register DATA REG 130 is released in parallel through horizontal data lines 111 to 115 into a column of configuration memory cells enabled by horizontal shift register SELECT REG 140. The row is addressed by shifting a high/low bit to one of the selected vertical lines 105–110 via the flip-flop array of horizontal shift register SELECT REG 140 using one shift per frame. The loading of data is therefore performed in a Serial In Parallel Out (SIPO) mode. In this way, configuration cells from 100-00 to 100_0y are loaded at the same time using their respective data lines 111 to 115 by enabling their common clock line 105. And similarly, each column of configuration cells will be loaded by enabling their respective clock line 105–110 one at a time.

FIG. 2 is a schematic diagram of a portion of an FPGA 200 in accordance with one embodiment of U.S. Pat. No. 6,057,704 entitled "Partially Reconfigurable FPGA And Method Of Operating The Same". FPGA 200 includes frame register 210, row decoder 209, write buffers 201–203, read buffers 204–206, row access transistors 211–213, row lines 221–223 and associated parasitic capacitances 221C–223C, row pull-up transistors 291–293, column select lines 231–232, cell access transistors 241–246, configuration memory cells 251–256, column select circuits 261–262, column voltage line 270 and column voltage circuit 280. Column select circuits 261 and 262 include inverters 263–264, p-channel field effect transistors (FETs) 265–266 and n-channel FETs 267–268. Column voltage circuit 280 includes p-channel FETs 271–272 and inverter 273. Together, frame register 210, row decoder 209, write buffers 201–203, read buffers 204–206 and row access transistors 211–213 form a row access circuit. Similarly, column voltage circuit 280 and column select circuits 261 and 262 form a column access circuit.

Frame register 210 receives and stores a plurality of configuration data values. These configuration data values are typically received from an external source, but can also be received from an internal source. The configuration data values are transferred from frame register 210 to an array of configuration memory cells, which includes configuration memory cells 251–256. The configuration data values can be written from frame register 210 to the array of configuration memory cells on a full column or partial column basis. The configuration data values can be read from the array to frame register 210 on a full column basis.

The configuration data values stored in configuration memory cells 251–256 are provided to control predetermined programmable interconnection points (PIPs) and define lookup table contents. The PIPs and lookup tables, in response to the configuration data values, configure the FPGA. The configuration data values can also be read from the configuration memory cells 251–256 to the frame register 210.

A pair of CMOS inverters, which are cross-coupled to form a latch, form each of configuration memory cells 251–256. The configuration memory cells 251–256 are arranged in an array of rows and columns. Thus, configuration memory cells 251 and 252 are in a first row of the array, configuration memory cells 253 and 254 are in a second row of the array, and configuration memory cells 255 and 256 are in the last row of the array. Similarly, configuration memory cells 251, 253 and 255 are in a first column of the array and configuration memory cells 252, 254 and 256 are in a second column of the array. Frame register 210 can be located on one side of the array of configuration memory cells or frame register 210 can extend through a central location of the array of configuration memory cells, or there can be more than one frame register in FPGA 200.

Each of configuration memory cells 251–256 is coupled to one of row lines 221–223 through an associated cell access transistor 241–246. The source of each cell access transistor is coupled to an associated row line, and the drain of each cell access transistor is coupled to an associated configuration memory cell. Row lines 221–223, in turn, are coupled to associated write buffers 201–203, respectively, through associated row access transistors 211–213, respectively. Row lines 221–223 are also coupled to associated read buffers 204–206, respectively. Row lines 221–223 are relatively long lines, which extend substantially across the width of FPGA 200, and connect to diffusion regions of many cell access transistors. As a result, each of the row lines 221–223 has a significant associated parasitic capacitance. The capacitances 221C–223C associated with row lines 221–223 are shown in dashed lines in FIG. 2.

Each of write buffers 201–203 and read buffers 204–206 is coupled to frame register 210 as illustrated. The gate of each of the row access transistors 211–213 has a dedicated connection to row decoder 209. As a result, any number of the row access transistors 211–213 can be enabled at any given time. The row decoder 209 helps to enable the partial reconfiguration of FPGA 200. Pull-up transistors 291–293 are turned on by asserting an active low PRECHG signal, thus pulling lines 221–223 high.

The cell access transistors associated with each column of the array of configuration memory cells are connected to an associated column select line. Thus, the gates of cell access transistors 241, 243 and 245 are coupled to column select line 231. Similarly, the gates of cell access transistors 242, 244 and 246 are coupled to column select line 232.

Each of the column select lines 231–232, in turn, is connected to an associated column select circuit 261–262, respectively. Column select circuits 261 and 262 are included so that a choice of voltages (i.e., a read voltage or a write voltage) can be provided from column voltage line 270 to column select lines 231 and 232. Column select circuit 261 includes an inverter 263, which is coupled to receive a column select signal CS1. The output terminal of inverter 263 is coupled to the gates of p-channel FET 265 and n-channel FET 267. The drain and source regions of n-channel FET 267 are connected to column select line 231 and ground (the off voltage), respectively. The source and drain regions of p-channel FET 265 are coupled to column voltage line 270 and column select line 231, respectively. Column select circuit 262 is connected to column select line 232 in a similar manner.

Column voltage line 270 is coupled to column voltage supply circuit 280 as illustrated. Thus, the drains of p-channel FETs 271 and 272 are coupled to column voltage line 270. The sources of p-channel FETs 271 and 272 are coupled to receive voltages of 5 Volts and 2.5 Volts, respectively. The Vcc supply voltage of FPGA 200 is 5 Volts. Both the read voltage and the write voltage are greater than the threshold voltage of the cell access transistors, and the write voltage is greater than the read voltage. If the chip is designed to operate with a supply voltage of less than 5 Volts, the read and write voltages are correspondingly lower.

As there are a large number of configuration columns in a high density FPGA core; the data lines have significant capacitance value. For ensuring the proper and fast write operation on configuration latches, there is a need to place write buffers at intermediate stages on data lines.

For configuration readback, all the data lines are precharged to logic '1' and a low voltage is applied to the selected column line. The voltage should be low enough so that it does not disturb the latch value. The limitation of this scheme is that it requires generating another voltage supply for read operation. The design is sensitive to noise on the column voltage line, which may disturb the latched value. For high-density devices, the presence of intermediate write buffers on data lines limits the readback operation. Therefore, there is a need for a scheme for a single voltage readback operation without disturbing latch value for high-density device with intermediate data buffers.

BRIEF SUMMARY OF THE INVENTION

To obviate the drawbacks of the prior art, one embodiment of the instant invention provides a simple and robust technique of configuration data readback using distributed buffers to ensure fast read and write operation on configuration latches.

This embodiment of the invention eliminates the second voltage required for read operation.

One embodiment of the invention provides an improved configuration memory structure providing fast read and write operation comprising one or more distributed buffers cascaded together, the output of first buffer driving a length of data line and complementary data line which terminate at the input of succeeding buffer. The buffer includes:

a precharging element connected between a source and the data line and complementary data line;

a data sensing and holding element connected between the source and the data line and complementary data line; and a tristate element connected to the output of the data sensing and holding element.

The number of the buffers depends upon the capacitance associated with the metal data lines.

In one embodiment, the memory structure comprises six transistor SRAM cells, the precharging element is a PMOS transistor, the data sensing and holding element is a half latch, and the tristate element is a tristate inverter.

One embodiment of the invention is a method for performing fast read and write operation that includes the steps of:

providing distributed buffers;

precharging the data line and complementary data line to the required voltage;

sensing and holding the data at the input of each the buffer; and tristating the data line and complementary data line.

BRIEF DESCRIPTION OF THE SEVERAL VIEWS OF THE DRAWINGS

The invention is now described with reference to the accompanying drawings.

DETAILED DESCRIPTION OF THE INVENTION

Figure 1:
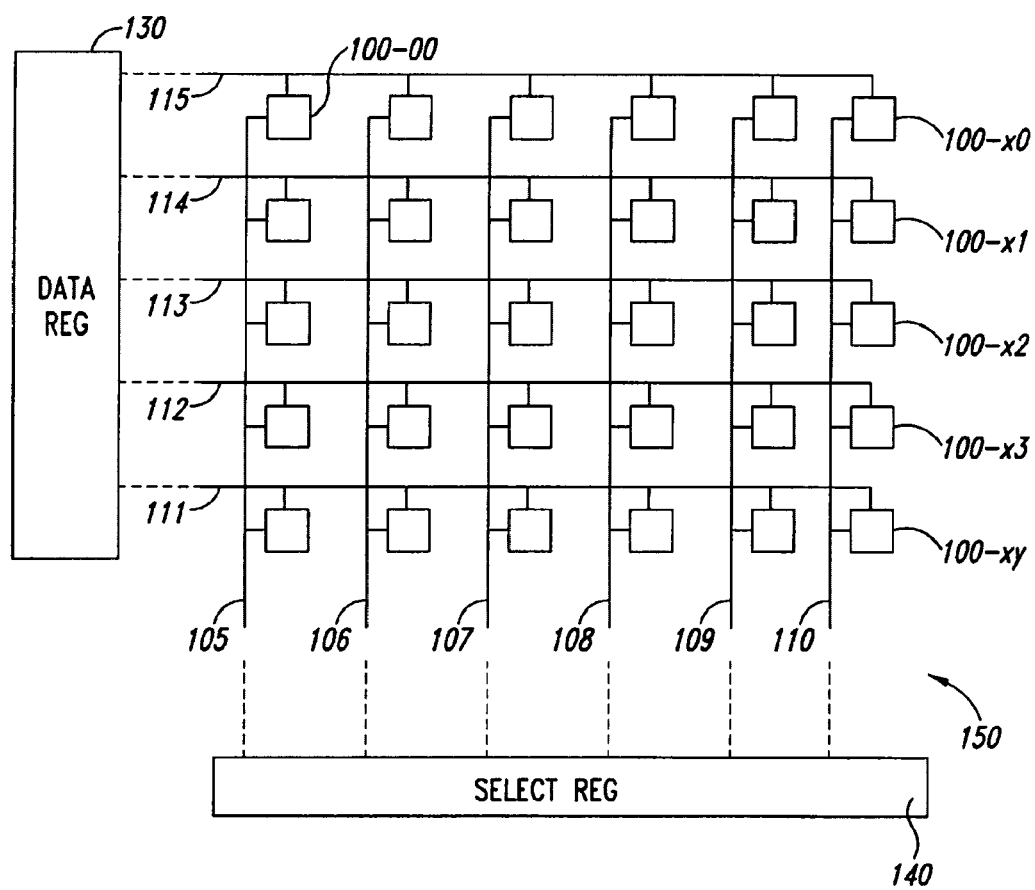
FIG. 1 illustrates a configuration memory array according to the prior art.
Figure 2:
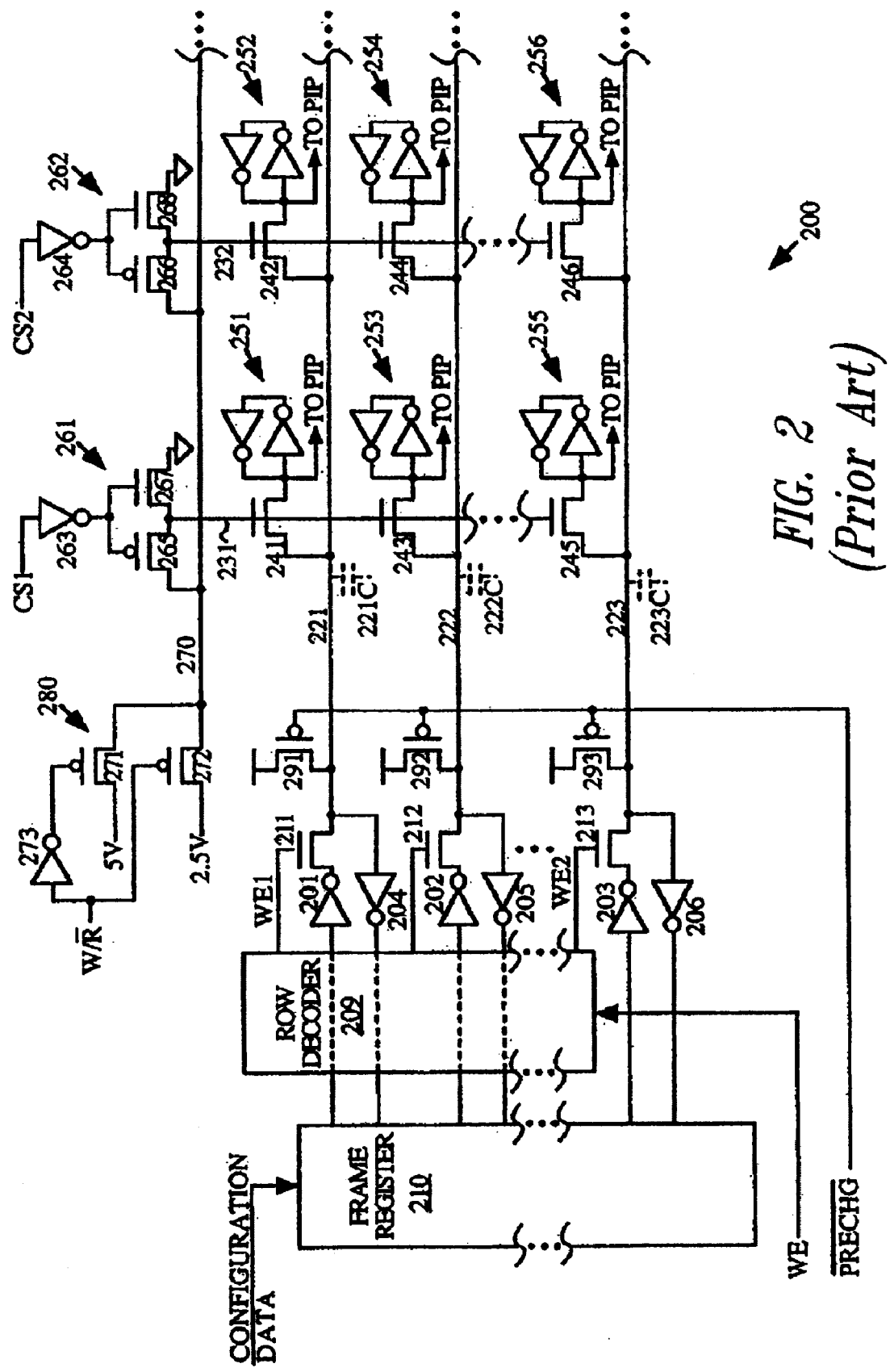
FIG. 2 is a schematic diagram in accordance with the U.S. Pat. No. 6,057,704.
Figure 3:
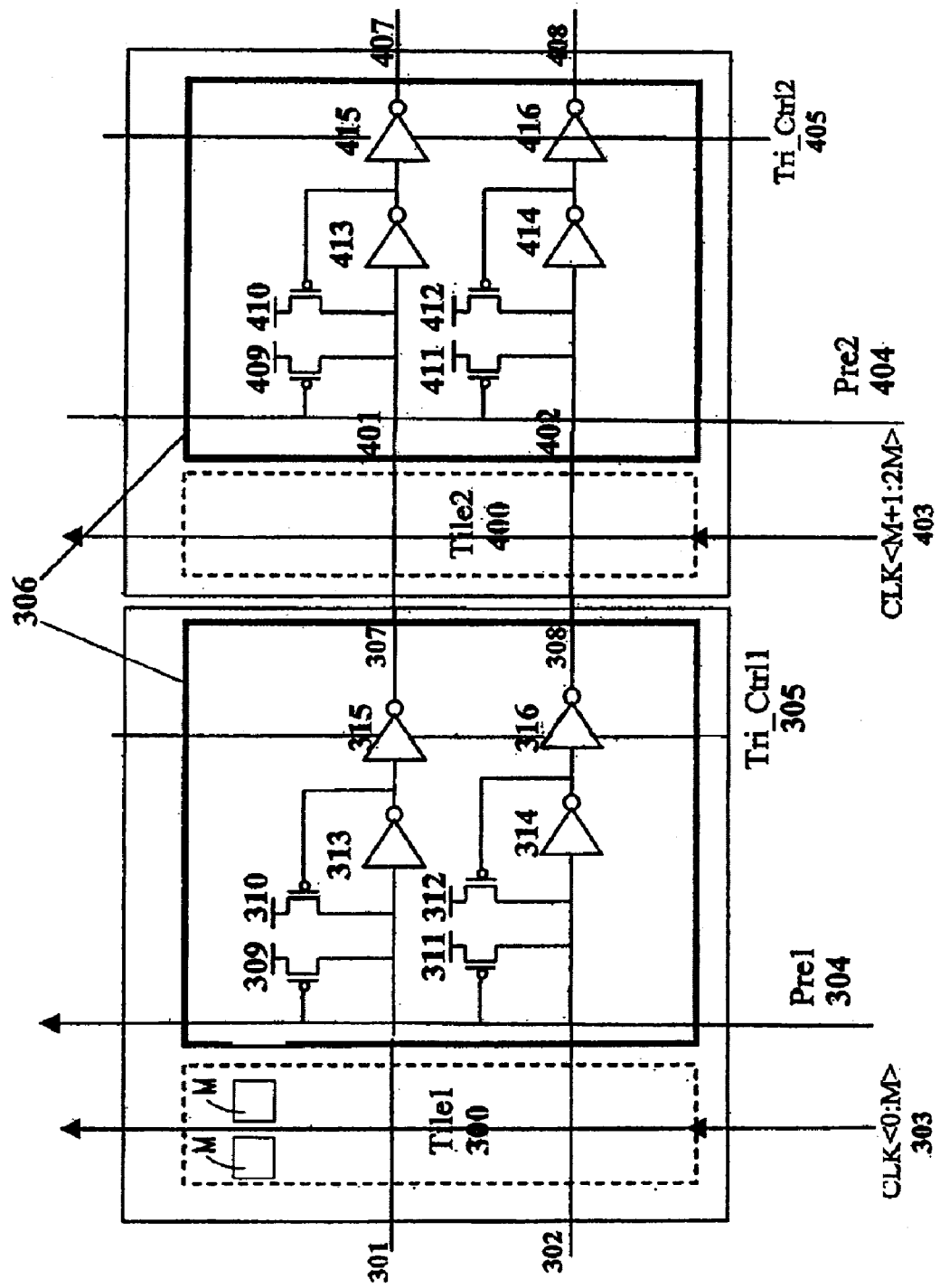
FIG. 3 represents the schematic of a buffer in accordance with one embodiment of the invention.

FIG. 3 represents the schematic of a buffer placed between two tiles of memory cells of a configuration memory array. Each tile includes a sub-array of memory cells (M) as the configuration latches. Preferably each memory cell M is a six-transistor (6T) memory cell that includes two cross-coupled inverters, each with two CMOS transistors, a write transistor, and a read transistor. The tiles (300, 400) also include data lines (301, 401) and inverted data lines (302, 402) connected to the memory cells. CLK<0:M> 303 are column select lines for configuring the memory cells of the tile 300. Similarly CLK<M+1:2M> 403 are column select lines for configuring the memory cells of the tile 400.

A tristate driver and pre-charge logic 306 is incorporated between every two titles (for e.g., tile 300 and tile 400) for driving the data lines as well as inverted data lines (301, 401, 302, 402) for configuring and precharging the same during configuration data readback. Each tristate driver and precharge logic 306 includes P-channel pre-charge transistors (309, 311, 409, 411); weak P-channel pull-up transistors (310, 312, 410, 412); data sensing and hold elements (313, 314, 413, 414) implemented by inverters; and tristate inverters (315, 316, 415, 416).

The complementary lines (307, 407, 308, 408) represent the output of tristate drivers (315, 316, 415, 416), which are being fed to the respective data lines of the adjacent tile. The Tri_Ctrl signals (305, 405) are the tristate control signals for the tristate drivers (315, 316, 415, 416). The configuration logic is responsible for generation of tristate control signals (305, 405) during configuration and readback operation. Precharge signals (304, 404) are generated by the configuration logic during configuration readback operation. These signals are used to control the pre-charge transistors (309, 311, 409, 411) to pre-charge the data lines and inverted data lines (301, 401, 302, 402). The total number of configuration bits per tile are M×N.

The configuration data is written in the memory latches M as follows:

All the Tri_Ctr signals (305, 405) associated with all the tiles (300, 400) in FPGA core are pulled to logic '1' so that all tristate inverters (315, 316, 415, 416) get enabled and work as data line and inverted data line drivers. This ensures proper and fast write operation in a high density FPGA.

All the precharge signals (304, 404) for all the tile columns are also pulled to logic '1' to turn off the pre-charge transistors (309, 311, 409, 411) to disable precharging of data and inverted data lines during write operation.

Once the tristate and precharge signals are pulled high, one of the column select lines is enabled to write a configuration data frame into the selected column.

Figure 4:
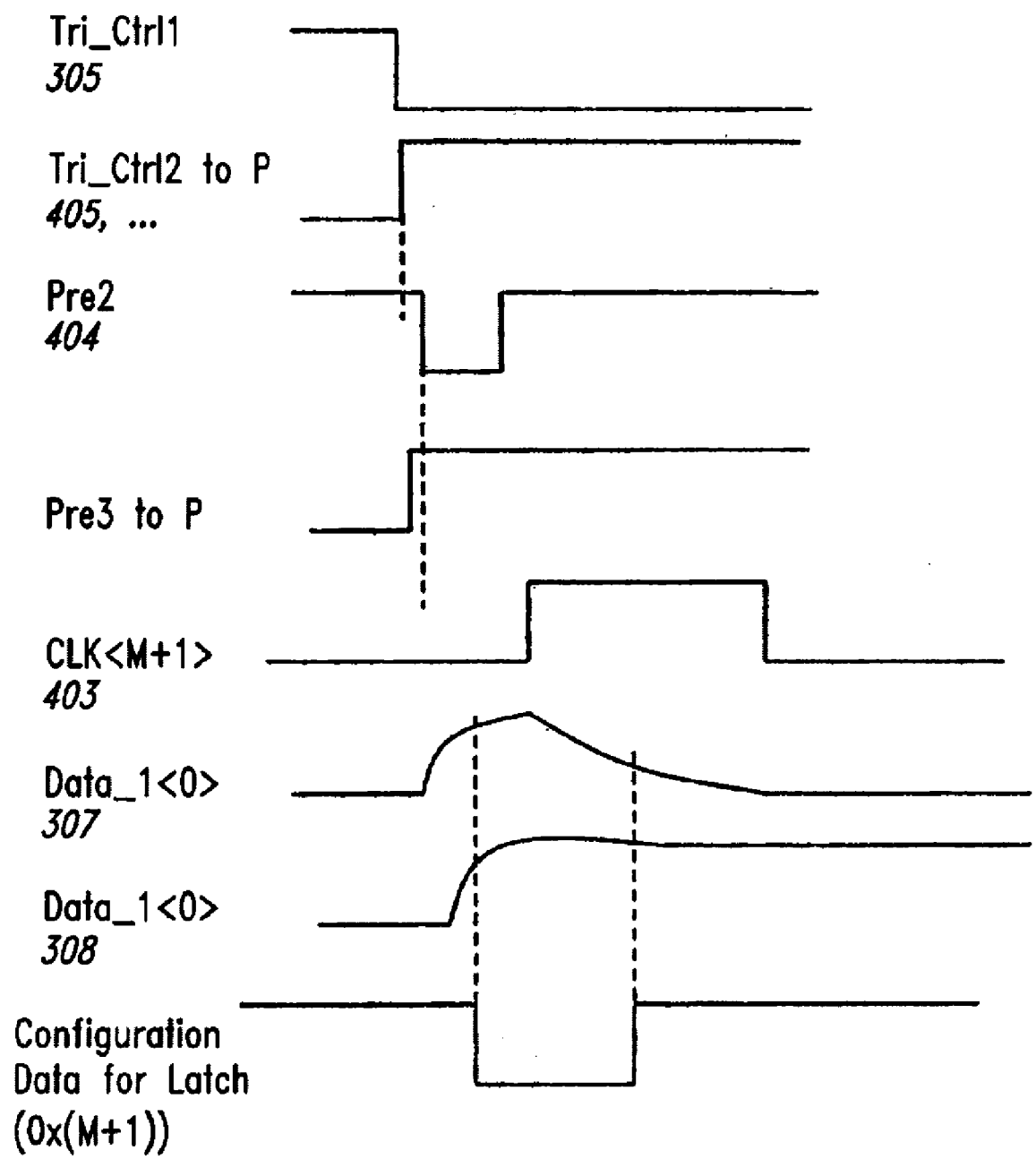
FIG. 4 shows waveforms of control signals generated by configuration logic in accordance with one embodiment of the invention.

FIG. 4 shows the status of control signals generated by configuration logic for reading a configuration data column using tile 400 an example. The Tri_Ctrl 305 signal is made low thereby putting the data line 307 and the inverted data line 308 in a high impedance state. Other tristate signals (405) remain high so that other tristate inverters (415, 416) are enabled. Tristate inverters (415, 416) associated with consecutive tiles act as a buffer for the read data.

Precharge signal 404 is made low for a duration to precharge the lines 307 and 308 to logic 1 value. The duration is decided by the size of the precharge transistors 409 and 411 and the capacitance associated with metal lines 307 and 308. The precharge signals Pre3 to P for precharge logic 306 associated with consecutive tiles are made inactive.

One of the column select line CLK<M+1> 403 of tile 400 is made active for a duration so that the configuration data from the configuration latch is available on 307 and 308. This data is sensed and held by the inverter 413 and passed to the tristate inverter 415 associated with the tile 400. As explained above, since the rest of the tristate inverters for consecutive tiles are active the data is available after the last tile, where it can be read.

A weak P-channel pull up transistor 410 is placed in 306 to ensure that the data lines and inverted data lines remain pre-charged to logic 1 even if there is some timing gap between turning off of transistors 409 and 411 and enabling of configuration column by column select line 403.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A memory structure providing fast read and write operations, comprising:
   one or more distributed buffers cascaded together, including a first buffer having an output driving an output data line and a complementary output data line which terminate at an input of a succeeding buffer, said first buffer including:
      a first precharging element connected between a source and an input data line;
      a second precharging element connected between the source and a complementary input data line;
      a first data sensing and holding element connected between the input data line and said output data line;
      a second data sensing and holding element connected between the complementary input data line and the complementary output data line;
      a first tristate element connected between an output of said first data sensing and holding element and the output data line; and
      a second tristate element connected between an output of said second data sensing and holding element and the complementary output data line.

2. The configuration memory structure as claimed in claim 1 wherein the number of said buffers depend upon capacitances associated with the data lines.

3. The configuration memory structure as claimed in claim 1 wherein said memory structure comprises six transistor SRAM cells connected to the data lines.

4. The configuration memory structure as claimed in claim 1 wherein said precharging elements are transistors.

5. The configuration memory structure as claimed in claim 4 wherein said transistors are PMOS transistors.

6. The configuration memory structure as claimed in claim 1 wherein each data sensing and holding element is a half latch.

7. The configuration memory structure as claimed in claim 1 wherein each tristate element is a tristate inverter.

8. A method for performing fast read and write memory operations, comprising the steps of:
   providing distributed buffers;
   precharging an input data line and a complementary input data line to a pre-charge voltage;
   sensing and holding data at an input of each said buffer; and
   tristating an output data line and a complementary output data line.

9. The method of claim 8 wherein the precharging step precharges the input data line and the complementary input data line of a selected one of the buffers and disables precharging of input data lines and complementary input data lines of buffers adjacent to the selected buffer.

10. The method of claim 8 wherein the tristating step tristates the output data line and complementary output data line of a selected one of the buffers, the method further comprising placing in a high impedance state an output data line and a complementary output data line of a buffer that is immediately previous to the selected buffer.

11. The method of claim 8 wherein the tristating step tristates the output data line and the complementary output line of a selected one of the buffers and tristates output data lines and complementary output data lines of buffers positioned downstream of the selected buffer.

12. A memory structure providing fast read and write operations, comprising:

first and second arrays of memory cells;
a first buffer positioned between the first and second arrays, the first buffer including:
   a first precharging element connected between a source and a first input data line that is coupled to the first array;
   a first data sensing and holding element connected between the first input data line and a first output data line that is coupled to the second array; and
   a first tristate element connected between an output of the first data sensing and holding element and the first output data line.

13. The memory structure of claim 12, further comprising:
a second buffer positioned downstream of the second array, the second buffer including:
   a second precharging element connected between the source and a second input data line that is connected to the second array;
   a second data sensing and holding element connected between the second input data line and a second output data line; and
   a second tristate element connected between an output of the second data sensing and holding element and the second output data line.

14. The memory structure of claim 13, further comprising means for causing the second precharging element to precharge the second input data line while disabling precharging of the first input data line.

15. The memory structure of claim 13, further comprising means for causing the second tristate element to tristate the second output data line while disabling the first tristate element.

16. The memory structure of claim 13, further comprising means for causing the second tristate element to tristate the second output data line while causing subsequent tristate elements of subsequent buffers to tristate output data lines of the subsequent buffers which are positioned downstream of the second buffer.

17. The memory structure of claim 12 wherein the memory cells are six transistor SRAM cells.

18. The memory structure of claim 12 wherein the first buffer further includes:
   a second precharging element connected between the source and a complementary input data line that is coupled to the first array;
   a second data sensing and holding element connected between the complementary input data line and a complementary output data line that is coupled to the second array; and
   a second tristate element connected between an output of the second data sensing and holding element and the complementary output data line.

19. The memory structure of claim 12 wherein the first data sensing and holding element is a half latch.

20. The memory structure of claim 12 wherein the first tristate element is a tristate inverter.

* * * * *